(12) United States Patent  (10) Patent No.: US 7,391,252 B2
Meier  (45) Date of Patent: Jun. 24, 2008

(54) CIRCUIT ARRANGEMENT WITH A SHORT-CIRCUIT PROTECTIVE CIRCUIT

(75) Inventor: Heinz-Wilhelm Meier, Kalletal (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 54 days.

(21) Appl. No.: 11/261,916

(22) Filed: Oct. 31, 2005

(65) Prior Publication Data

US 2006/0250175 A1  Nov. 9, 2006

(30) Foreign Application Priority Data

Oct. 30, 2004 (DE) .................. 10 2004 053 031

(51) Int. Cl.
 *H03K 17/60* (2006.01)
(52) U.S. Cl. .................. 327/478; 327/333; 327/538; 327/543; 361/87
(58) Field of Classification Search .................. 327/478, 327/309, 310, 312, 313, 318, 319, 322, 324, 327/327, 328, 333, 538–543; 361/87, 93.1, 361/100

See application file for complete search history.

(56) References Cited

U.S. PATENT DOCUMENTS 5,786,970 A * 7/1998 Nao et al. .................. 361/18

OTHER PUBLICATIONS

Gibilisco, Stan and Neil Sclater, Encyclopedia of Electronics, 1990, TAB professional and Reference Books, 2$^{nd}$ Edition, p. 577.*
Horowitz, P. et al.; The Art of Electronics, Second Ed., 1994; pp. 3 & 179; Cambridge University Press.

* cited by examiner

*Primary Examiner*—Tuan T. Lam
*Assistant Examiner*—Diana J Cheng
(74) *Attorney, Agent, or Firm*—David S. Safran

(57) ABSTRACT

A circuit arrangement in which the temperature dependency of the short-circuit current and/or the influence of the output signal by the load current are at least partially avoided has first and second input connections, first and second output connections, a supply voltage connection as well as with a voltage-controlled voltage source, an output stage and a short-circuit protective circuit, whereby the output signal from an input voltage applied to input connections is generated via voltage-controlled voltage source and output stage. The circuit arrangement is characterized in that a voltage sequencing circuit and a shunting resistor connected in parallel to voltage sequencing circuit are part of the short-circuit protective circuit and in that a parallel circuit formed of the voltage sequencing circuit and a shunting resistor is connected to the second output connection and second input connection.

6 Claims, 3 Drawing Sheets

CIRCUIT ARRANGEMENT WITH A SHORT-CIRCUIT PROTECTIVE CIRCUIT

BACKGROUND OF THE INVENTION

1. Field of the Invention

The invention relates to a circuit arrangement with a first input connection and a second input connection, with a first output connection and a second output connection, with a supply voltage connection as well as with a voltage-controlled voltage source, an output stage and a short-circuit protective circuit, whereby the output signal from an input voltage applied to the input connections is generated via the voltage-controlled voltage source and the output stage.

2. Description of Related Art

Circuit arrangements of the type being discussed here have been known for a long time in various embodiments and are used universally in circuit engineering, where an input voltage is to be converted into an output signal, whereby the circuit arrangement normally can have available a higher power on the output side than the power that is necessary on the input side to control the circuit arrangement. Such circuit arrangements are typically found in, e.g., isolation amplifiers, signal converters and power modules. A more common application for such circuits is in, for example, the conversion of a voltage of a first voltage range into a voltage of a second voltage range for adapting the first voltage to a standardized voltage interface, which operates with, e.g., voltage values in the range of 0 V to 10 V.

In principle, in the design of circuit arrangements of the type being discussed here, operating safety, but also certifiability under relevant standards, should be considered for the sake of practical handling, as the circuit behaves in the case of an output-side short circuit, i.e., if the output connections are connected to one another in a very low-ohmic manner. If no special circuit-engineering measures are taken, the danger exists in the case of short circuiting that the output-side behavior of the circuit arrangement can no longer be controlled on the input side, a high loss of power is converted in the circuit arrangement or the output stage of the circuit arrangement, and electrical devices connected to the circuit arrangement and/or on the output side are even destroyed.

For these reasons, circuit arrangements of the type at issue here are often provided, on the output side, with electronic current limiters that, in the case of a short circuit, at least prevent destruction of the circuit arrangement. If the output stage is controlled, for example, via current driven by the voltage-controlled voltage source, it is known from experience and relevant literature to measure the load or short-circuit current flowing via the—short-circuited—output connections and to direct the current controlling the output stage based on the level of the load current to an equal extent past the output stage. Such a short circuit protective circuit can be implemented by, for example, a bipolar transistor, which is controlled as a function of the voltage decreasing on a "sensor" resistor arranged in a load circuit and which directs the current controlling the output stage to the input of the output stage and thus prevents a further increase of the load current and thus limits the short-circuit current (Tietze, U.; Schenk, Ch.: "Halbleiter-Schaltungstechnik [Semiconductor Circuit Engineering]," 12$^{th}$ Edition, Springer-Verlag, 2002, pages 909-910).

It is disadvantageous in such short-circuit protective circuits, which detect the level of the load current via a "sensor" resistor in the load current path and ultimately also the short-circuit current, that the load current-dependent drop in voltage influences the output signal via this resistor—thus, for example, a voltage that is applied to the output connections, in normal operation—and causes a constant power loss. It is also disadvantageous when, using simple, unregulated semiconductor components, such as, e.g., bipolar transistors in the short-circuit protective circuit, that the level of the short-circuit current that triggers the protective circuit is temperature-dependent based on the temperature dependency of the semiconductor components. In the case of the above-mentioned bipolar transistors, this is, e.g., the temperature dependency of the flow voltage of the diodes, operated in the forward direction, within the bipolar transistors. When using a bipolar silicon transistor controlled via the base-emitter segment, the temperature dependency of the flow voltage of the base-emitter diode is, for example, −2 mV/K.

The problem underlying the teaching of this invention is therefore to configure and to develop a circuit arrangement with a voltage-controlled voltage source, with an output stage and with a short-circuit protective circuit such that the above-mentioned drawbacks, especially the temperature dependency of the short-circuit current and/or the influence of the output signal by the load current are—at least partially—avoided.

SUMMARY OF THE INVENTION

The circuit arrangement according to the invention, in which the previously deduced and demonstrated formulation of the problem is achieved, is first and essentially characterized in that a voltage sequencing circuit (also known in the art as a voltage follower circuit) and a shunting resistor connected in parallel to the voltage sequencing circuit are part of the short-circuit protective circuit, and in that the parallel circuit that consists of the voltage sequencing circuit and the shunting resistor is connected, on the one hand, to the second output connection, and on the other hand, the second input connection. By the special production of the short-circuit protective circuit according to the invention, a direct intervention in the path of the load current is avoided, i.e., in the connection of the output stage to the output connections, such that the output signal issued by the output connections also cannot be influenced by the load current.

A common reference potential of the above-mentioned circuit parts is ensured by the connection of the voltage sequencing circuit and the shunting resistor that is connected in parallel to the second input connection of the circuit arrangement; in this case, this can be a reference potential that is used circuit-wide, such as, e.g., the mass potential, but also any other suitable electrical potential.

The voltage sequencing circuit is oriented according to the invention such that it is connected on the input side to the second input connection and on the output side to the second output connection. It is thus brought about that the reference potential also applied to the second input connection is relayed via the voltage sequencing circuit to the second output connection of the circuit arrangement. As long as the voltage sequencing circuit is operated in its normal operating range, it is possible to ensure the transmission of potential from its input to its output, regardless of what current it occupies or releases. In this normal operating range, there is no difference in potential in the shunting resistor because of the parallel circuit of the voltage sequencing circuit and shunting resistor and because of the identical potentials between the input side and the output side of the voltage sequencing circuit, such that also no current can flow by it. In this connection, it follows that the voltage sequencing circuit in normal operation of the circuit arrangement—thus not in the case of a short circuit—must fully take up a load current flowing via the output connections if a load is connected to the output connections.

Only once the voltage sequencing circuit is no longer used in its normal operating range—if it thus, for example, must take up a higher current than is possible based on its inner wiring—is the voltage sequencing circuit no longer able to transmit the potential provided on its input side to the output side thereof. The result is that the output-side potential of the voltage sequencing circuit deviates from the potential specified on the input side. Because of the potential difference that is now arising in the connections of the shunting resistor, a portion of the short-circuit current that can no longer be taken up by the voltage sequencing circuit is discharged via the shunting resistor.

Since voltage sequencing circuits usually are implemented by control circuits that are regulating-difference-free to a very great extent and thus also temperature-dependent influences can be adjusted, and even ohmic resistors—such as the shunting resistor—do not show any pronounced temperature dependency, a short-circuit protection without significant temperature dependency is also realized with the circuit arrangement according to the invention.

The following remarks are indicated for special embodiments of the invention.

In a preferred embodiment of the circuit arrangement according to the invention, the voltage-controlled voltage source is implemented by a simple operational amplifier circuit by the inverting input of an operational amplifier with one connection each of two wiring resistors and the non-inverting input of the operational amplifier with the first input connection of the circuit arrangement and the first wiring resistor being connected via the output stage to the output of the operational amplifier and the second wiring resistor being connected to the second output connection of the circuit arrangement. By this measure, the circuit arrangement is provided with a high-ohmic input between the input connections. At the same time, the output stage that is bonded in the voltage control circuit can be controlled via the low-ohmic output of the operational amplifier.

In another preferred embodiment, the output stage is implemented with use of a transistor, which is controlled via its control electrodes by the output of the voltage-controlled voltage source. With its other two electrodes, the transistor of the output stage is integrated into the load circuit in such a way that the first load circuit electrode is connected to the supply voltage connection and the second load circuit electrode is connected to the first output connection of the circuit arrangement. By using suitable transistors in the output stage, circuit arrangements that are suitable for the small signal range as well as for higher power requirements can be realized in a simple way.

In another especially preferred embodiment, the voltage sequencing circuit is implemented by means of a second operational amplifier and a feedback resistor, whereby the feedback resistor feeds back the output of the second operational amplifier to the inverting input of the second operational amplifier. The non-inverting input of the second operational amplifier thus represents the input side of the voltage sequencing circuit and is consequently connected to the second input connection of the circuit arrangement, while the inverting output of the second operational amplifier is connected to the output side of the circuit arrangement and thus is also connected to the second output connection of the circuit arrangement.

If the above-described, preferred embodiments of the circuit arrangement are implemented together, an especially advantageous effect of the entire circuit, surprisingly enough, which is described below, is achieved.

The operating range of an operational amplifier is usually defined by the voltage range of the operational voltage connected thereto. If the operational voltage range is determined by an upper operational voltage and a lower operational voltage, the above-described, preferred embodiment of the voltage sequencing circuit can take up a load current on the output side that is so high that the lower operational voltage drops specifically in terms of amount via the feedback resistor; in this case, the inverting input of the second operational amplifier can still be kept specifically to the potential that is specified by the potential of the non-inverting input of the second operational amplifier. In this case, the voltage at the output of the second operational amplifier is the same as the lower operational voltage of the second operational amplifier, which cannot be reduced below this value.

Another increase of current necessarily results in that a voltage that goes over the amount of the lower operational voltage decreases with the feedback resistor, and the potential at the output of the voltage sequencing circuit increases over the potential of the voltage sequencing circuit specified on the input side. In this case, the current that flows out over the short-circuit protective circuit thus depends only on the potential that arose on the second output of the circuit arrangement, the constant lower operational voltage of the second operational amplifier, the size of the feedback resistor of the voltage sequencing circuit and the size of the shunting resistor used in the short-circuit protective circuit. The short-circuit current thus changes proportionally to the change of the potential arising on the second output connection.

In the case of short-circuited output connections, especially advantageous ratios are present in the preferred embodiment of the circuit arrangement, since the series connection of the wiring resistors of the voltage-controlled voltage source is short-circuited on the output side and thus the input voltage is applied to the second output of the circuit arrangement. As was previously explained, in this case, the current that flows out via the short-circuit protective circuit, however, depends only on the input voltage, the constant lower operational voltage of the second operational amplifier, the ohmic feedback resistor, and the ohmic shunting resistor, specifically such that the short-circuit current that flows out via the short-circuit protective circuit changes in proportion to a change in the input voltage.

This especially preferred embodiment of the circuit arrangement thus represents a voltage-controlled voltage source with short-circuit protection in the normal operating case and a voltage-controlled current source in the case of short-circuiting. Thus, the output signal of the circuit arrangement can also be adjusted as defined in the short-circuiting case and can also change as defined by variation of the input voltage. Consequently, the short-circuiting case can also be viewed as a normal operating situation of the preferred circuit arrangement. This property can then be used advantageously, e.g., if both a defined voltage signal and a defined current signal can be given off via the output connections of the circuit arrangement.

In particular, there are now various possibilities for configuration and developing the circuit arrangement according to the invention. To this end, reference is made to the following detailed description of the preferred embodiments together with the accompanying drawings.

DETAILED DESCRIPTION OF THE INVENTION

Below, the circuit arrangement according to the invention is described based on a preferred embodiment with use of certain electronic components that are based on certain technologies (bipolar transistors, operational amplifiers). The invention could also be produced just as well with use of components that are based on other technologies (e.g., field effect transistors, discrete design of operational amplifier circuits or use of more highly-integrated circuits). Quite generally, the single requirement for the implementation of the invention is thus the interaction according to the invention of the main modules of the circuit arrangement, independently of the technology, in which the individual modules are produced.

Figure 1:
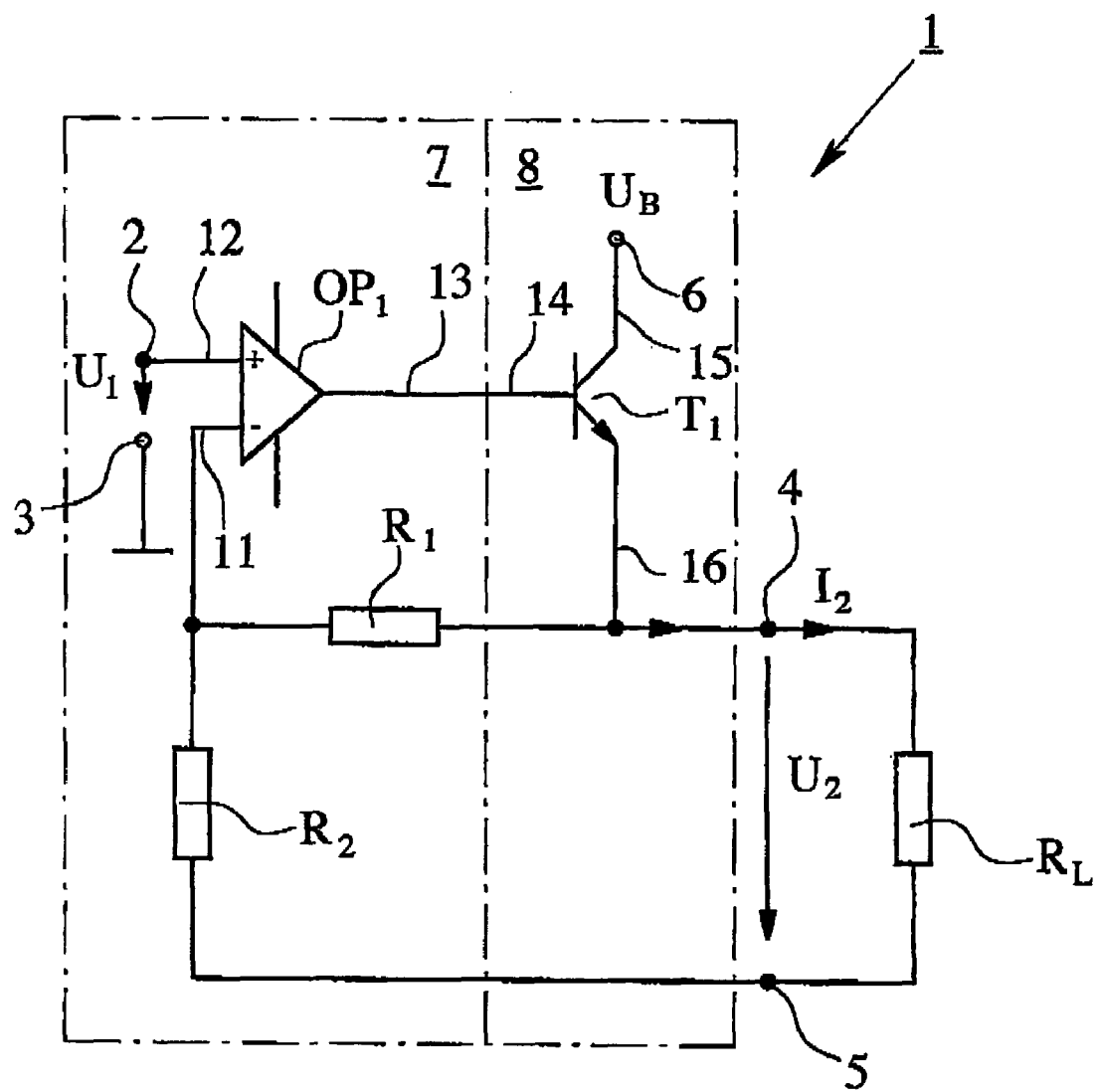
FIG. 1 shows an embodiment of a circuit arrangement without short-circuit protection.

The embodiment in FIG. 1 shows a circuit arrangement 1 with a first input connection 2 and a second input connection 3, with a first output connection 4 and a second output connection 5, with a supply voltage connection 6 as well as with a voltage-controlled voltage source 7, an output stage 8, but without a short-circuit protective circuit. To this end, the circuit is suitable for producing an output signal, namely an output voltage $U_2$, via an input voltage $U_1$ applied to input connections 2, 3 by means of the voltage-controlled voltage source 7 and the output stage 8 on output connections 4, 5.

In normal operating conditions, the output of circuit arrangement 1 is loaded by an electric load that is connected to output connections 4, 5—here represented by a resistor $R_L$—which should limit the load current to a compatible value even in the case of a fully controlled output stage 8. If output connections 4, 5 are short-circuited, however, the necessary output-side current limiter is lacking, and output stage 8 or even a device that takes up the short-circuit current via output connections 4, 5 is in direct danger of being destroyed by the short-circuit current.

Figure 2:
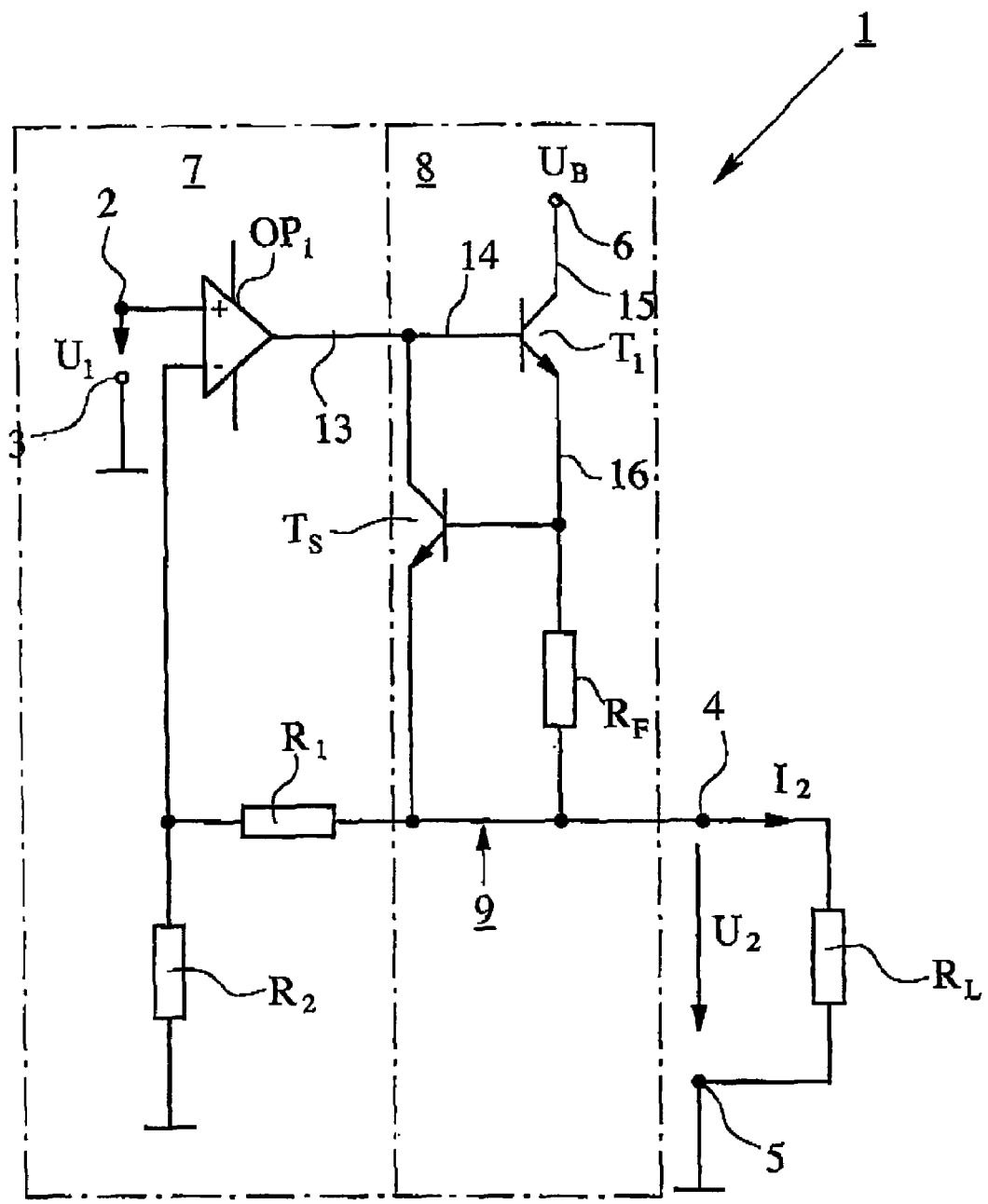
FIG. 2 shows an embodiment of a circuit arrangement with short-circuit protection that is known from the prior art.

From the prior art, a circuit arrangement 1 shown in FIG. 2 that provides a short-circuit protective circuit 9 for limiting the load current in the case of short-circuiting is known. The known short-circuit protective circuit 9, in this case, provides an ohmic "sensor" resistor $R_F$ in the path of the load current, on which a voltage in proportion to the load current decreases. If the voltage drop reaches the values of the base-emitter flow voltage of a bipolar protective transistor $T_S$, which is connected in parallel with the base-emitter segment to the sensor resistor $R_F$, the controlled protective transistor $T_S$ derives a large portion of the current controlling output stage 8 until output stage 8 has reduced the load or short-circuit current to a fixed value.

It is disadvantageous in this configuration of short-circuit protective circuit 9 that a power loss is transformed via the sensor resistor $R_F$ even in the normal operation of the circuit arrangement 1 and is influenced by the arrangement of the sensor resistor $R_F$ in the load path of the output signal of circuit arrangement 1. Further, the temperature dependency of the flow voltage of the base-emitter segments of protective transistor $T_S$ also causes a temperature dependency of the short-circuit current arising in the case of short-circuiting.

Figure 3:
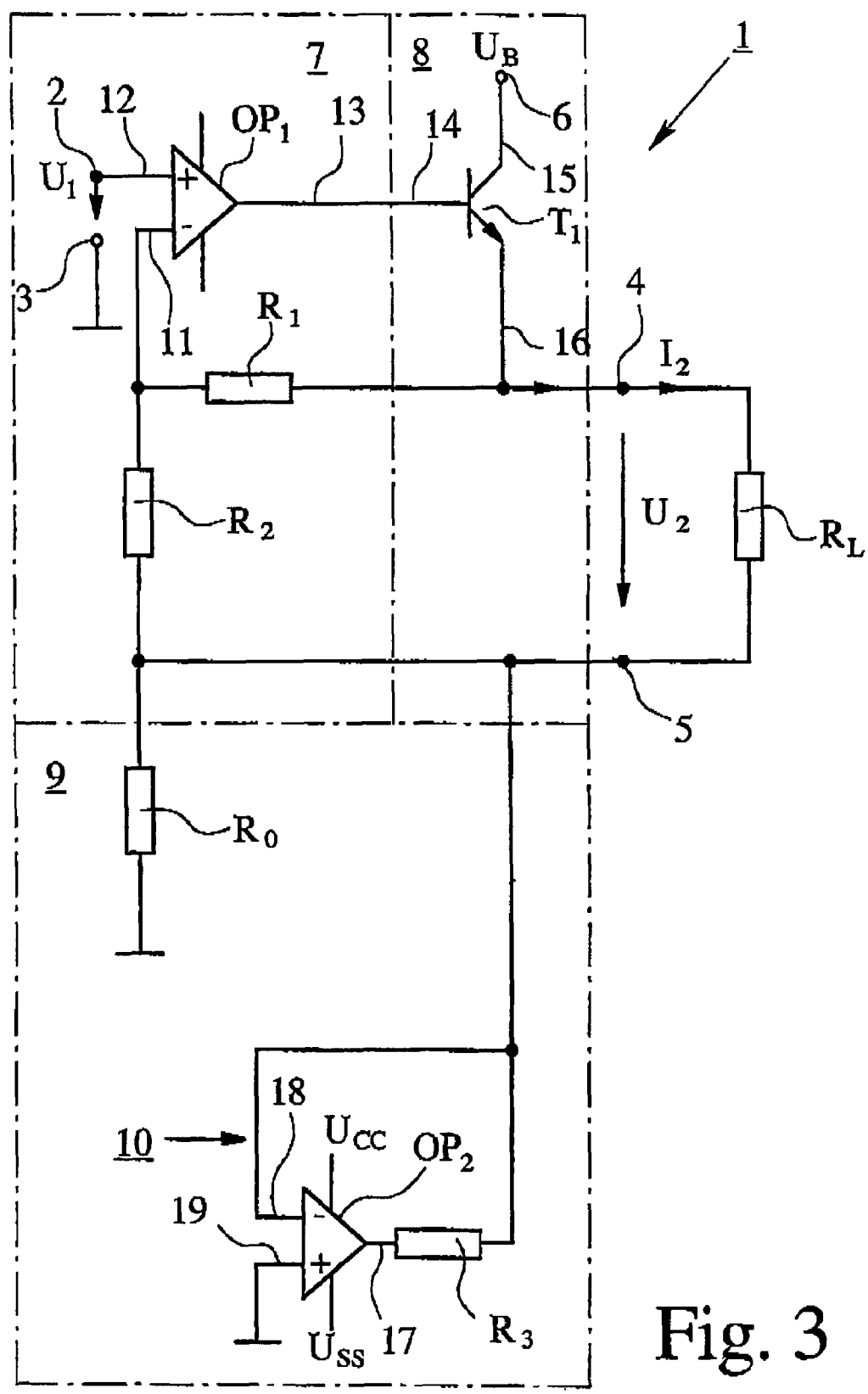
FIG. 3 shows a preferred embodiment of the circuit arrangement according to the invention.

The preferred embodiment of circuit arrangement 1 that is shown in FIG. 3 provides a short-circuit protective circuit 9, which comprises a voltage sequencing circuit 10 (also known in the art as a voltage follower circuit) and a shunting resistor $R_O$ that is connected in parallel to voltage sequencing circuit 10. The parallel circuit from the voltage sequencing circuit 10 and shunting resistor $R_O$ is connected to, on the one hand, the second output connection 5 and, on the other hand, to the second input connection 3. In this case, voltage sequencing circuit 10 is oriented such that it is connected on the input side with second input connection 3 and on the output side with second output connection 5.

In the preferred embodiment according to FIG. 3, the voltage-controlled voltage source 7 is implemented by a simple operational amplifier circuit that comprises an operational amplifier $OP_1$ and two wiring resistors $R_1$ and $R_2$. In this case, inverting input 11 of operational amplifier $OP_1$ is connected to, in each case, a connection of the two wiring resistors $R_1$, $R_2$, and non-inverting input 12 of operational amplifier $OP_1$ with first input connection 2. Further, the first wiring resistor $R_1$ is connected via output stage 8 to output 13 of operational amplifier $OP_1$, and second wiring resistor $R_2$ is connected to second output connection 5. In the preferred embodiment, output stage 8 is produced using a bipolar transistor $T_1$, whereby transistor $T_1$ is controlled at its base 14 from output 13 of voltage-controlled voltage source 7 and is connected to its collector electrode 15 with supply voltage connection 6 and to its emitter electrode 16 with first output connection 4.

In a simple way, the preferred embodiment of circuit arrangement 1 produces essential properties of a circuit arrangement 1 to generate an output signal from an input voltage, i.a., a high input resistance between input connections 3, 4 and an output of the output signal that can be regulated and that can be varied within wide ranges based on the supply voltage $U_B$ on supply voltage connection 6 and by suitable selection of transistor $T_1$.

Voltage sequencing circuit 10 is implemented in the preferred embodiment of circuit arrangement 1 according to FIG. 3 by means of a second operational amplifier $OP_2$ and a feedback resistor $R_3$, whereby feedback resistor $R_3$ feeds back output 17 of second operational amplifier $OP_2$ to inverting input 18 of second operational amplifier $OP_2$. Inverting input 18 of second operational amplifier $OP_2$ is connected to second output connection 5, and non-inverting input 19 of second operational amplifier $OP_2$ is connected to second input connection 3. The operating range of second operational amplifier $OP_2$ is determined by upper operational voltage $U_{CC}$ and lower operating voltage $U_{SS}$. The mass potential applied on the input side to voltage sequencing circuit 10 via non-inverting input 19 of second operational amplifier $OP_2$ can be transferred to inverting input 18 of second operational amplifier $OP_2$ ("virtual mass") as long as no voltage, which lies outside the voltage range defined by $U_{CC}$ and $U_{SS}$, is necessary for potential balancing between output 17 and inverting input 18 of operational amplifier 2 via feedback resistor $R_3$.

If, in the case of short-circuiting, the short-circuit current to be taken up by voltage sequencing circuit 10 is so large that voltage sequencing circuit 10 must operate outside the operating range thereof, and because of this, a potential other than the mass potential is set on inverting input 18 of second operational amplifier $OP_2$, second output connection 5 of circuit arrangement 1 is raised in terms of potential just like a connection of shunting resistor $R_O$. In the case of short-circuiting, a portion of the short-circuit current thus flows through shunting resistor $R_O$ against mass. In the preferred embodiment, a short circuit is produced between output connections 4, 5 at the same time that the series connection of wiring resistors $R_1$, $R_2$ in voltage-controlled voltage source 7 is short-circuited, such that input voltage $U_1$ is also applied to inverting input of operational amplifier $OP_1$ and thus also to the second output connection of the circuit arrangement. Short-circuit current $I_K$ that flows out over short-circuit connective circuit 9 is consequently produced in accordance with the relationship: $I_K = U_1/R_0 + (U_1 + U_{SS})/R_3$.

For the preferred embodiment according to FIG. 3, the especially surprising effect thus follows that a voltage-controlled voltage source with short-circuit protection becomes a voltage-controlled current source in the case of short-circuiting, by which the output signal can be controlled in addition by the input voltage $U_1$ on input connections 2, 3 in the case of short-circuiting. When using the circuit arrangement according to FIG. 3, the short-circuit case thus represents a controllable operating case and not a state of exception. The preferred circuit arrangement according to FIG. 3 can be used deliberately in short-circuiting operating conditions by, for example, a very low-ohmic load being connected to output connections 4, 5. In this case, the output signal is not a voltage but rather an output current that is controlled by input voltage $U_1$, which uses, for example, a standardized current interface, which operates in the range of 0-20 mA.

What is claimed is:

1. Circuit arrangement, comprising:
   a first input connection and a second input connection,
   a first output connection and a second output connection,
   a supply voltage connection,
   a voltage-controlled voltage source,
   an output stage, and
   a short-circuit protective circuit, the short-circuit protective circuit comprises a parallel circuit in which a shunting resistor is directly connected in parallel to a voltage follower circuit,
   wherein the parallel circuit is connected to the second output connection and to the second input connection, whereby an output signal is generated from an input voltage applied to the input connections via the voltage-controlled voltage source and the output stage.

2. Circuit arrangement according to claim 1, wherein the voltage-controlled voltage source comprises an operational amplifier and first and second wiring resistors, wherein an inverting input of the operational amplifier is connected to a connection of the first and second wiring resistors and a non-inverting input of the operational amplifier is connected to the first input connection, and wherein the first of the wiring resistors is connected via the output stage to an output of the operational amplifier and the second of the wiring resistors is connected to the second output connection.

3. Circuit arrangement according to claim 1, wherein the output stage has a transistor and wherein the transistor is controlled via a control electrode by an output of the voltage controlled voltage source, and is connected to a first load circuit electrode with the supply voltage connection and to a second load circuit electrode with the first output connection.

4. Circuit arrangement according to claim 3, wherein the transistor is a bipolar transistor.

5. Circuit arrangement according to claim 4, wherein the bipolar transistor is an npn transistor.

6. Circuit arrangement according to claim 2, wherein the voltage follower circuit comprises a second operational amplifier and a feedback resistor, and wherein the feedback resistor is adapted to feed back output of the second operational amplifier to an inverting input of the second operational amplifier, and the inverting input of the second operational amplifier is connected to the second output connection and a non-inverting input of the second operational amplifier is connected to the second input connection.

* * * * *